United States Patent
Arakawa

(10) Patent No.: US 6,990,642 B2
(45) Date of Patent: Jan. 24, 2006

(54) DESIGN METHOD FOR INTEGRATED CIRCUIT HAVING SCAN FUNCTION

(75) Inventor: Toshio Arakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 10/634,857

(22) Filed: Aug. 6, 2003

(65) Prior Publication Data

US 2004/0040006 A1 Feb. 26, 2004

(30) Foreign Application Priority Data

Aug. 21, 2002 (JP) ........................................ 2002-240729

(51) Int. Cl.
*G06F 17/50* (2006.01)

(52) U.S. Cl. .................................... 716/3; 716/4; 716/6
(58) Field of Classification Search ................ 716/1–6, 716/8–11, 16–18; 714/737, 733
See application file for complete search history.

(56) References Cited

U.S. PATENT DOCUMENTS 5,828,579 A * 10/1998 Beausang ...................... 716/2
5,949,692 A * 9/1999 Beausang et al. ............. 716/18
6,301,688 B1 * 10/2001 Roy .............................. 716/4
6,434,733 B1 * 8/2002 Duggirala et al. ............ 716/11
2004/0015788 A1 * 1/2004 Huang et al. .................. 716/1

* cited by examiner

*Primary Examiner*—Vuthe Siek
*Assistant Examiner*—Binh Tat
(74) *Attorney, Agent, or Firm*—Staas & Halsey LLP

(57) ABSTRACT

The present invention provides a method for designing LSI including a logic circuit equipped with a scan circuit without generating a hard-macro library for the scan flip flops constituting the scan circuit. According to the method, first netlist NL1 is converted into second netlist NL2 by adding scan circuit including scan flip-flops. Order data for connecting scan chain of the scan circuit is extracted from the second netlist NL2. Such second netlist NL2 is converted into third netlist NL3 including only hard-macros, and the third netlist NL3 is laid-out by re-ordering the scan chain so that the newly generated order data for is stored temporally. Fourth netlist NL4 including scan circuit formed by scan flip-flops of soft-macros is generated on the basis of the stored order data, then the fourth netlist NL4 is converted into fifth netlist NL5 by substituting the scan flip-flops of soft-macros for standard cells of hard-macros. Finally the generated fifth netlist is laid-out without re-ordering the scan chain.

6 Claims, 7 Drawing Sheets

COMPARATIVE EXAMPLE OF DESIGN PROCESS

DESIGN PROCESS OF EMBODIMENT

NETLIST NL1

NETLIST NL2

SCAN CHAIN BEFORE RE-ORDERING

---> INTRA WIRING ROUTE IN SFF
——> INTER WIRING ROUTE FOR SCAN CHAIN

SOFT MACRO SFF    SFF DEVELOPED AS HARD MACROS

SCAN CHAIN AFTER RE-ORDERING

---> INTRA WIRING ROUTE IN SFF
——> INTER WIRING ROUTE FOR SCAN CHAIN

DESIGN METHOD FOR INTEGRATED CIRCUIT HAVING SCAN FUNCTION

CROSS-REFERENCE TO RELATED APPLICATIONS

This application is based upon and claims the benefit of priority from the prior Japanese Patent Application No. 2002-240729, filed on Aug. 21, 2002, the entire contents of which are incorporated herein by reference.

BACKGROUND OF THE INVENTION

1. Field of the Invention

The present invention relates to an LSI (integrated circuit) design method, and more particularly to a design method for an integrated circuit equipped with a scan function.

2. Description of the Related Art

LSI design steps include a logic design step of designing a logic circuit for implementing a desired function; a step of laying out logic macros and logic cells that constitute the logic circuit, and interconnects connecting these logic cells on the basis of a netlist generated in the logic design step, and a verification step of performing timing verification for the logic circuit thus laid out, and so forth. In order to lay out the logic macros and logic cells and so forth, reference is made to a layout library containing the corresponding layout data. Further, the test patterns which are used in the timing verification are obtained by referencing a logic library that comprises function data for the logic macros and logic cells and so forth.

Logic cells are relatively small-scale circuit units such as flip flops, and NAND and NOR gates and the like, and logic macros are relatively large-scale circuit units such as processors and the like. However, both logic cells and logic macros are circuit units having predetermined functions and are registered in the logic library and the layout library, and are therefore referred to below generically as 'standard cells' or 'cells'.

In enlarged-scale LSIs, a scan circuit constituting a verification circuit is generally provided. In other words, in the design step, a plurality of flip flops in the logic circuit are substituted for flip flops equipped with a scan function and a circuit constitution in which these flip flops are connected by scan chain interconnects is produced. In the verification step, predetermined test data are inputted to the plurality of flip flops by being scanned in and, after the logic circuit has been caused to perform a predetermined cycle operation, the data in these flip flops are outputted by being scanned out, and a process of verifying whether or not the outputted data match the expected values is performed. The test data are generated automatically by means of a computer design tool on the basis of a circuit which includes the logic-designed logic circuit and the added scan circuit. Further, as described earlier, in order to generate the test data, reference is made to a logic library containing logic data for the cells that constitute the logic circuit.

FIG. 1 is a flowchart showing conventional LSI design steps. Steps S1 to S4 of FIG. 1 are all performed by means of functions which the CAD design tool comprises. First, at the point when the logic design step S1 is complete, a netlist NL1 containing data for connections between the cells that constitute the logic circuit is generated. At this stage, the netlist NL1 does not contain a verification scan circuit, that is, does not contain test data (DFT: Design For Test).

Therefore, in a test circuit synthesis step S2, delay flip flops (D-FF) in the logic circuit are extracted and then substituted for scan flip flops equipped with a scan function, and a scan chain is formed by connecting these scan flip flops in an arbitrary order. As a result, a netlist NL2 is generated. This netlist NL2 is data in which delay flip flops of the netlist NL1 generated in the logic design step S1 are substituted for scan flip flops, and includes connection data for forming the scan chain in addition to the connection data of the netlist NL1.

Test patterns are automatically generated (S3) for the logic circuit equipped with the scan circuit which is contained in the netlist NL2. In the step of automatically generating the test patterns, reference is made to a logic library F10 that contains data for the logic circuit equipped with the scan circuit which is contained in the netlist NL2, and logic data for the cells that constitute the logic circuit and for the added scan flip flops, whereby an input test pattern and the expected output test pattern are generated. These test patterns are registered in the form of a test pattern file F12 and used in the subsequent timing verification step (not shown).

In addition, an automatic layout & wiring step S4 is performed on the basis of the netlist NL2. In the automatic layout & wiring step S4, the layout of the cells in the netlist NL2 that constitute the logic circuit and the layout of interconnects that connect these cells are performed with reference to a layout library F14. As a result, a layout data file F16 is generated for the netlist NL2. This layout data file also contains layout data for the scan flip flops and the scan interconnects that connect the scan flip flops to constitute the scan chain. For this reason, reference is made in the automatic layout & wiring step S4 to the layout library F14 for a scan flip flop in addition to the layout library F14 for the cells constituting the logic circuit.

Here, the test data DFT represents scan flip flops and interconnects that connect same. According to conventional methods, the test data contained in the netlist NL2 is constituted by scan flip flops which are hard macros. 'Hard macros' refer to cells that are registered in the layout library and that can be laid out directly from a netlist. Therefore, in the above-cited example, the scan flip flops are hard macros because same are registered in the layout library. On the other hand, 'soft macros' are not registered in the layout library. Therefore, in order to be laid out, the soft macros are each developed as a plurality of hard macros (standard cells) which implement the functions of the soft macro, it being necessary to use the layout data of the layout library for these developed standard cells.

Returning now to FIG. 1, a check is also performed, for the layout data F16 generated in the automatic layout and wiring step S4, of whether or not all of the interconnects thus laid out can be realized. When the interconnects cannot be implemented, a check is made of whether or not the interconnects for the scan chain of the scan circuit can be laid out when priority is given to the cells that constitute the logic circuit and to the interconnects connecting these cells. When this is not possible, a re-order step is performed in which the order of the scan chain wiring alone is changed without changing the disposition of the cells and the interconnects connecting same. This is because, by changing the order of the scan chain, the interconnects connecting same are simplified and there is the probability that the layout will then be feasible. Because the scan circuit will change if the re-order step is carried out, the test pattern automatic generation step S3 is repeated such that the test patterns F12 are re-created for the logic circuit having the new scan chain.

However, as mentioned earlier, in order to generate the layout data from the netlist in accordance with the automatic layout and wiring step, reference must be made to the hard macros that contain the layout information for the standard cells registered in the layout library. Hence, in addition to the hard macros of the standard cells contained in the netlist NL1 that is generated in the logic design step S1, the hard macros of the scan flip flops introduced in the test circuit synthesis step S2 must also be registered in the layout library F14.

Therefore, in order to design a logic circuit with a scan function and perform the layout thereof, a layout library (hard macro library) for the scan flip flops serving to implement the scan function is required, and there are therefore problems such as an increase in the man hours involved in the library registration.

Further, in a case where a scan circuit for implementing the scan function is introduced and this circuit is developed as a plurality of standard cells without the use of a scan flip flop layout library, there are problems such as an increase in circuit scale.

SUMMARY OF THE INVENTION

Accordingly, it is an object of the present invention to provide a design method for an integrated circuit that obviates the need for a scan circuit layout library and that permits automatic layout of a logic circuit comprising a scan circuit by using only a layout library for standard cells.

It is a further object of the present invention to provide a design method for an integrated circuit that obviates the need for a scan circuit layout library, permits automatic layout of a logic circuit comprising a scan circuit by using only a layout library for standard cells, and simultaneously the surface area during layout is reduced.

It is yet another object of the present invention to provide a design method for an integrated circuit whereby the surface area during the layout of a logic circuit to which a scan circuit has been introduced is reduced.

In order to achieve the above objects, a first aspect of the present invention is a design method for an integrated circuit having a logic circuit, comprising: a first step of converting a first netlist, which has connection data for a logic circuit in which a plurality of standard cells including at least a first flip flop are connected, into a second netlist by converting the first flip flops into second flip flops equipped with a scan function and adding scan chain interconnects that connect the second flip flops; a second step of generating a third netlist by substituting the second flip flops in the second netlist for a plurality of standard cells that constitute the second flip flops, and generating scan-chain interconnect data; a third step of performing layout of the standard cells and interconnects thereof which are contained in the third netlist, in accordance with the third netlist, optimizing an order of the scan chain interconnects on the basis of the scan chain interconnect data, and generating scan-chain interconnect order data; and a fourth step of generating a fifth netlist, from a fourth netlist that includes the second flip flops, and scan chain interconnects that depend on the scan-chain interconnect order data, by substituting the second flip flops for a plurality of standard cells, and of performing layout of the standard cells and interconnects thereof which are contained in the fifth netlist, in accordance with the fifth netlist.

According to the above first aspect of the invention, order data for the scan chain interconnects that can be laid out is determined temporarily in the third step, and automatic placement is performed with respect to the fifth netlist which is constituted by standard cells and is derived from the fourth netlist which is generated by using this order data. It is therefore possible to design an integrated circuit without the use of a layout library for the second flip flops equipped with a scan function.

In order to achieve the above objects, a second aspect of the present invention comprises: a first step of converting a first netlist, which has connection data for a logic circuit in which a plurality of standard cells including at least a first flip flop are connected, into a second netlist by converting the first flip flops into second flip flops equipped with a scan function and adding scan chain interconnects that connect the is second flip flops; a second step of generating a third netlist by substituting the second flip flops in the second netlist for a plurality of standard cells that constitute the second flip flops and substituting the substitute standard cell and other standard cell for a different standard cell of a smaller surface area; and a third step of performing layout of the standard cells and interconnects thereof which are contained in the third netlist, in accordance with the third netlist, for generating layout data.

According to the above second aspect of the present invention, as a result of substituting the second flip flops equipped with a scan function for a plurality of standard cells and further substituting the substitute standard cell and other standard cell for a different standard cell, the surface-area increase that accompanies the addition of the second flip flops can be made smaller.

DESCRIPTION OF THE PREFERRED EMBODIMENTS

An embodiment example of the present invention will be described hereinbelow with reference to the drawings. However, the scope of protection of the present invention is not limited to or by the embodiment example below, but is instead intended to cover the inventions appearing in the claims as well as any equivalents thereof.

Figure 1:
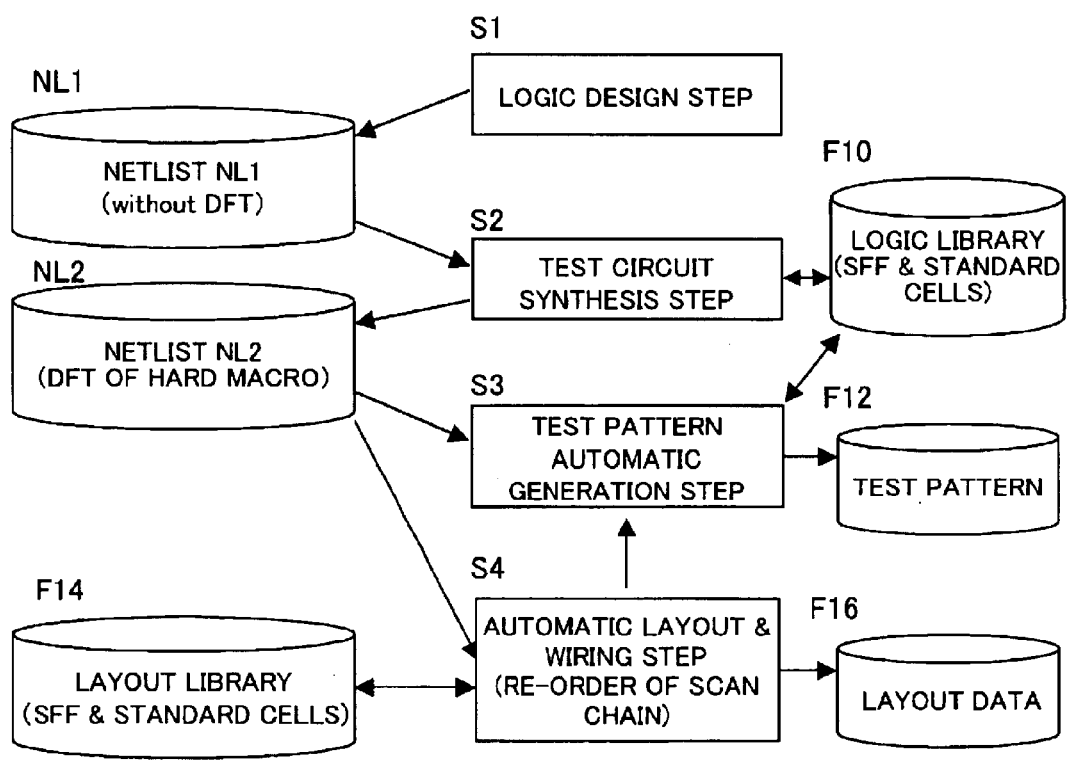
FIG. 1 is a flowchart showing a conventional LSI design step.
Figure 2:
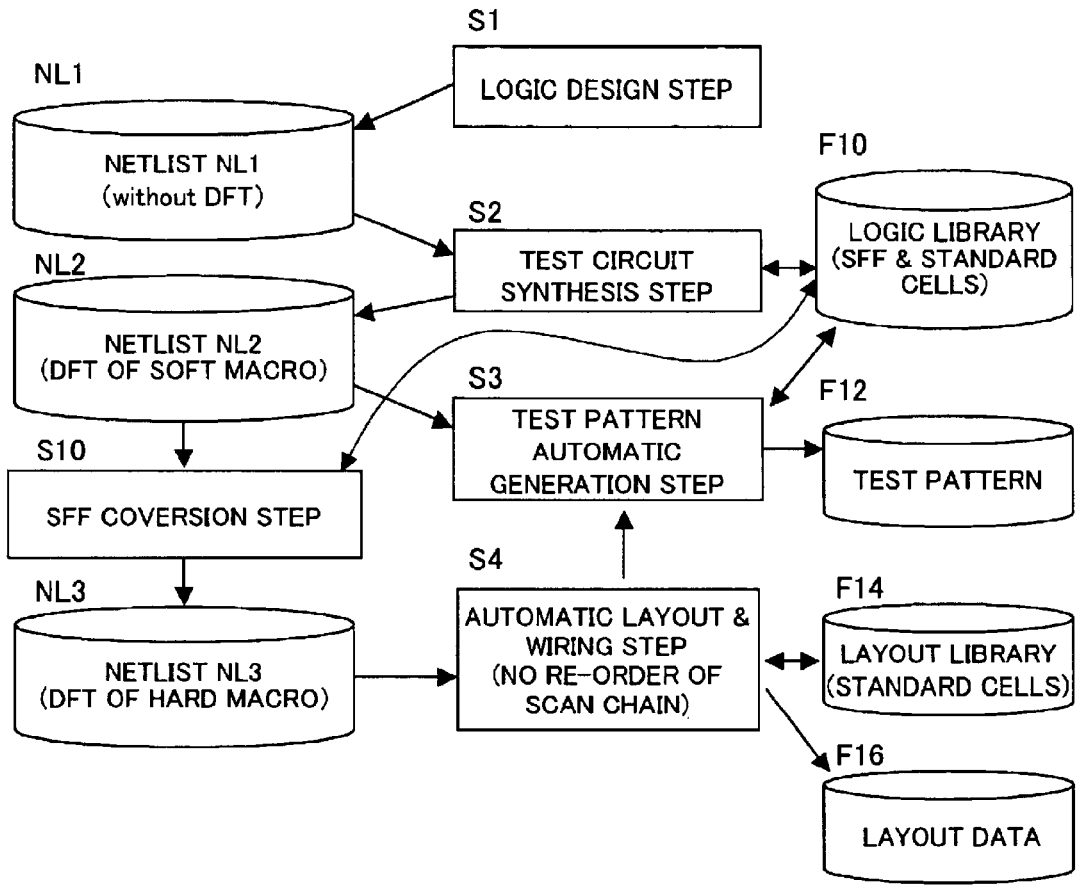
FIG. 2 is a flowchart showing design steps of a comparative example of the present embodiment.

FIG. 2 is a flowchart showing design steps of a comparative example of the present embodiment. A description for the comparative example of FIG. 2 which is a partial modification of the conventional example in FIG. 1 will be provided before the present embodiment is described.

In the comparative example, the netlist NL1 generated in the logic design step S1 is converted to the netlist NL2 for a logic circuit that comprises a test circuit in which flip flops equipped with a scan function are connected by a scan chain, in the test circuit synthesis step S2. In the same way as the conventional example, in this step S2, a conversion is performed by substituting delay flip flops for scan flip flops and adding scan chain interconnects that connect these scan flip flops. However, the comparative example is an example in which hard macros for the test circuit scan flip flops are not registered in the layout library and hence the scan flip flops in the netlist NL2 are soft macros which must be developed as a plurality of standard cells.

Test patterns are automatically generated (S3) for the logic circuit thus defined in the netlist NL2. These test patterns are also the same as those of the conventional example, the test patterns F12 being generated by referencing logic data for standard cells and scan flip flops registered in the logic library F10. At this stage, the generation of test patterns is possible due to the presence of the scan flip flops.

In addition, in the comparative example, in order to perform automatic layout without the use of hard macros for the scan flip flops, the scan flip flops in the netlist NL2 will be developed (S10) as a plurality of standard cells (hard macros) that permit the same functions to be implemented.

Figure 3:
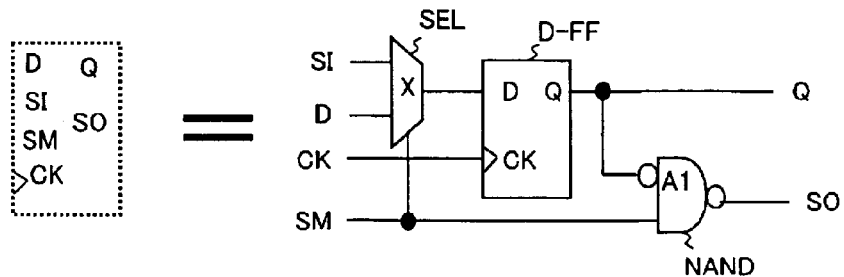
FIG. 3 shows an example in which a soft-macro scan flip flop is developed as standard cells which are hard macros.

FIG. 3 shows an example in which a soft-macro scan flip flop is developed as standard cells which are hard macros. In this figure, the block with the broken line indicates a soft macro, while the blocks with solid lines denote hard macros. The scan flip flop, which is used as a test circuit, is constituted by a selector SEL, a delay flip flop D-FF and a NAND gate. That is, the soft-macro scan flip flop SFF can be developed as three standard cells. Also, these standard cells SEL, D-FF, and NAND are registered in the logic library F10 and are also registered in the layout library F14 as hard macros. Therefore, by developing the scan flip flop SFF which is a soft macro as a plurality of lower-level hard macros, the layout of the scan flip flop SFF is possible by using hard-macro layout information.

This scan flip flop has a function as a cell that constitutes the original logic circuit and a function as a scan circuit that is used for the inputting/outputting of a test pattern. When the scan mode signal SM is at the high level, the scan flip flop functions as a scan circuit and the scan input SI is connected to the data input D of the delay flip flop D-FF, whereby a data output Q is outputted to the scan output terminal SO via the NAND gate. Further, when the scan mode signal SM is at the low level, the scan flip flop functions as the delay flip flop D-FF that constitutes the logic circuit and the normal data input D is connected to the data input of the delay flip flop D-FF. The data output Q is outputted from the data output terminal Q as is.

Returning now to FIG. 2, the test circuit of the netlist NL3 is constituted by standard cells as shown in FIG. 3. Hence, all of the cells that constitute the netlist NL3 are standard cells which are registered in the layout library F14 as the hard macros of these cells. Therefore, automatic layout and wiring is performed with respect to the netlist NL3 with reference to the layout library F14, to generate layout data F16 (S4).

As detailed above, the scan flip flop added as a test circuit is treated as a soft macro, and because, at the time of performing the automatic layout and wiring step S4, this soft macro is developed as a plurality of standard cells (hard macros) which implement the same function, the hard macros for the scan flip flop need not be registered beforehand. However, the original scan flip flop data is lost as a result of temporarily developing the scan flip flop as a plurality of standard cells. In other words, data for the scan flip flop is not present in the netlist NL3, and it is accordingly impossible to discriminate the corresponding scan chain interconnects. As a result, the order of the scan chain interconnects cannot be optimized during the automatic layout and wiring step S4. Therefore, although there is no need to use hard macros for the scan flip flop in this comparative process, because optimization to repeat the layout of the scan chain interconnects is not possible, there are cases where the layout of the wiring cannot be performed due to the degree of complexity thereof.

Figure 4:
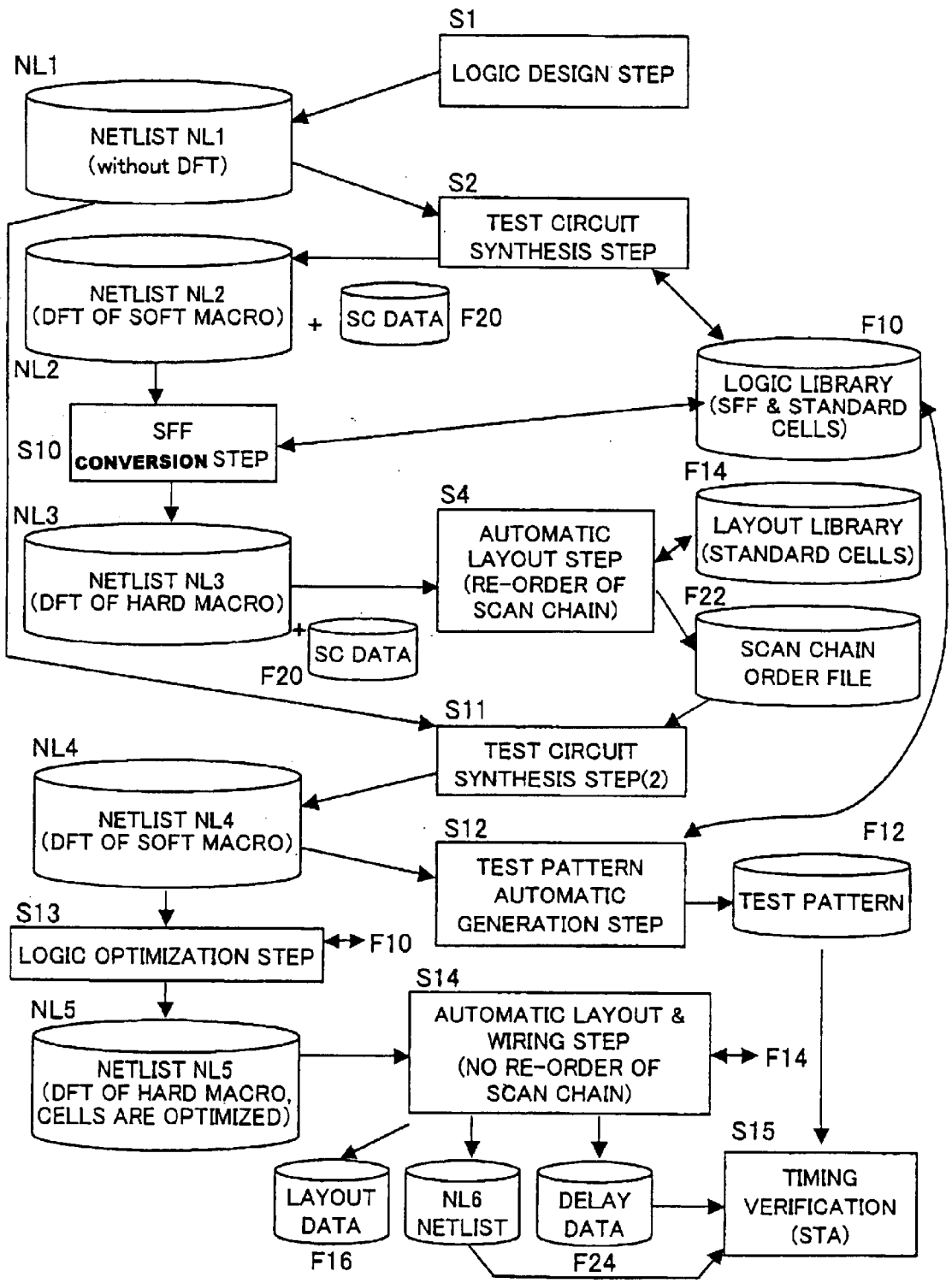
FIG. 4 is a flowchart showing design steps according to the present embodiment.

FIG. 4 is a flowchart showing design steps according to the present embodiment. In the embodiment example, when the test circuit has been developed as hard macros after being added in the form of a soft macro, connection data for constructing the scan chain is first generated, and at the point when automatic layout on the basis of the netlist resulting from the hard macro development has been performed, optimization of the scan chain order is carried out. Then, using the scan-chain order data obtained through this optimization, a netlist, according to which the scan flip flops (soft macros) are connected so as to establish the optimized scan-chain order, is generated. Test patterns are then generated from the netlist thus generated, and layout data is then generated upon performing the automatic layout and wiring step after the soft macros of the test patterns have been developed as hard macros. Because, in the automatic layout and wiring step, the optimization of the scan-chain wiring has already been performed, layout is possible without repeating the optimization of the scan chain wiring.

The design steps will be described in detail below according to FIG. 4. Similarly to the conventional example and the comparative example, the netlist NL1 for the logic circuit in which a plurality of standard cells are connected is generated by logic design step S1. This netlist NL1 does not contain a test circuit. Hence, in the test circuit synthesis step S2, the delay flip flops in the netlist NL1 are substituted for scan flip flops and the interconnects for a scan chain that connects the scan flip flops in any given order are added to generate the netlist NL2. At this stage, the scan flip flops are soft macros.

Figure 5:
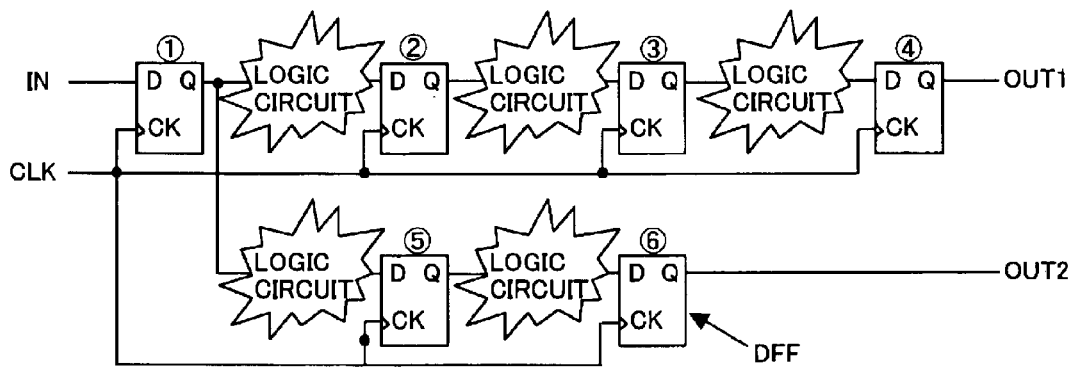
FIG. 5 shows an example of the netlist NL1.

FIG. 5 shows an example of the netlist NL1. The logic circuit of this netlist comprises an input IN, outputs OUT1 and OUT2, and clock terminals CLK, and six delay flip flops 1 to 6 are contained in a logic circuit group. An input IN is supplied to this logic circuit so that this circuit operates in sync with clocks CLK, and outputs OUT1 and OUT2 are outputted. In this operation, data are stored in the six delay flip flops D-FF. Therefore, the netlist NL1 contains data for a plurality of standard cells that constitute the logic circuit group and for the delay flip flops contained in these standard cells, as well as data for the interconnects connecting these standard cells and delay flip flops.

Figure 6:
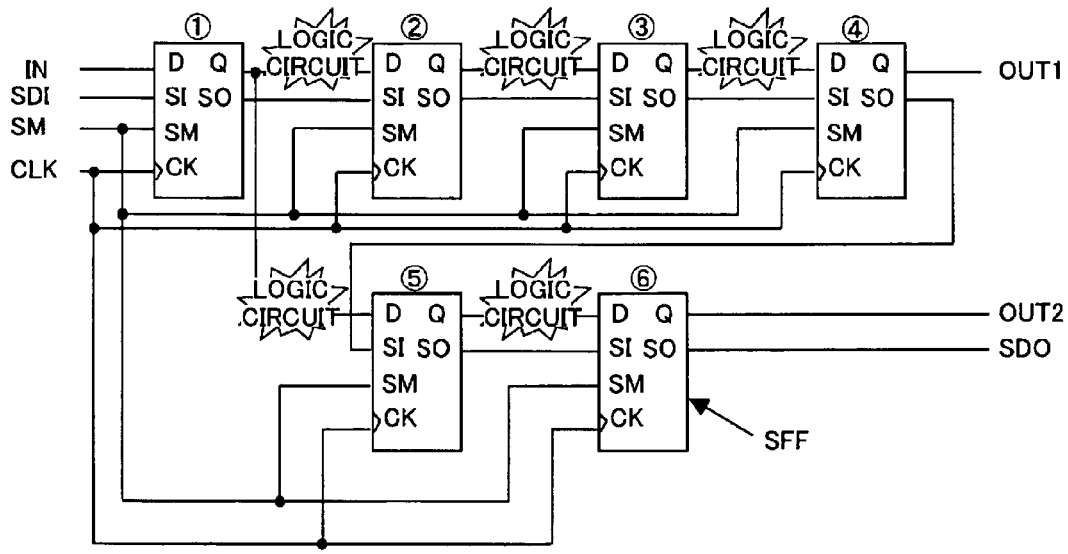
FIG. 6 shows an example of the netlist NL2.

FIG. 6 shows an example of the netlist NL2 which is generated in the test circuit synthesis step S2. All of the delay flip flops D-FF of the netlist NL1 of FIG. 5 have been substituted for scan flip flops SFF, and scan chain interconnects for connecting the scan inputs SI and scan outputs SO of the scan flip flops have been added in addition to a scan data input terminal SDI and a scan data output terminal SDO. Further, wiring serving to supply the scan mode signal SM that switches between scan mode and normal mode to the scan flip flops SFF has also been added. The scan flip flops SFF are soft macros which are registered in the logical library comprising the logic information but are not registered in the layout library that is constituted by layout information.

In the logic circuit equipped with a test circuit which is shown in FIG. 6, a test pattern input is scanned in from the scan data input terminal SDI and the test pattern is stored in the six scan flip flops SFF. In this condition, clocks CLK are supplied to cause the logic circuit to perform a predetermined cycle operation, whereupon the data which are stored in the scan flip flops are outputted from the scan data output terminal SDO as a result of being scanned out. Verification of the operation of the logic circuit is then performed by comparing the outputted data with a test pattern constituting the expected values.

Returning now to FIG. 4, in the netlist NL2 generated in the test circuit synthesis step S2, the scan flip flops which constitute the test circuit are constituted by soft macros and the connection order of these scan flip flops is of any given order. Here, the data for the scan chain interconnects that connect the scan flip flops SFF is extracted as the scan chain data F20. This data indicates which of the wiring is a scan-chain interconnect. In other words, the wiring which connects the scan data input SDI and the initial-stage scan input SI, the wiring between the scan flip flops which connects one of the scan outputs SO and the next scan input SI thereof, and the wiring which connects the final-stage scan output SO and the scan data output SDO, which are shown in FIG. 6, are contained in the scan chain data F20.

Therefore, in the scan flip flop conversion step S10, the scan flip flops constituting soft macros in the netlist NL2 are developed as a plurality of hard macros as shown in FIG. 4, whereby the netlist NL3 is generated. At such time, the scan chain data F20 is maintained as is. Hence, even if the scan flip flops constituting soft macros are developed as a plurality of standard cells which are hard macros, the data F20 which distinguishes the scan chain interconnects is maintained.

The automatic layout step S4 is performed with reference to the layout library F14, on the basis of the netlist NL3 resulting from the hard-macro development. Because all of the cells in the netlist NL3 are standard cells which are registered in the layout library as hard macros, the automatic layout can be performed. In the automatic layout step, the disposition of each cell is determined in accordance with the layout information in the layout library, and the layout of the interconnects that form connections between the cells is also determined. An algorithm for the automatic layout is well known and is therefore not described in detail here.

Figure 7:
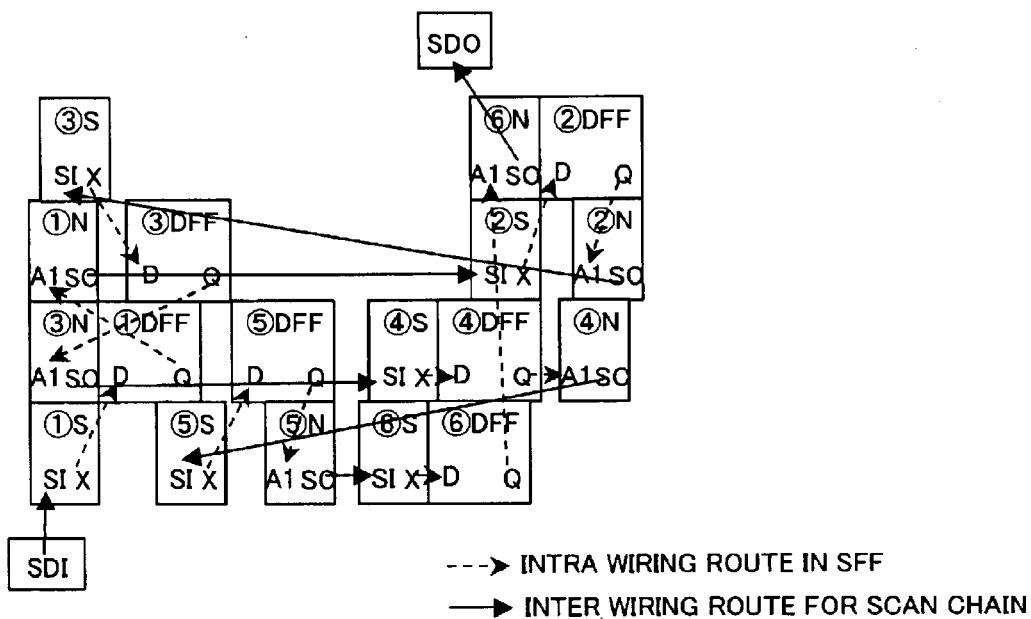
FIG. 7 shows an example of a layout condition before scan chain re-order.
Figure 8:
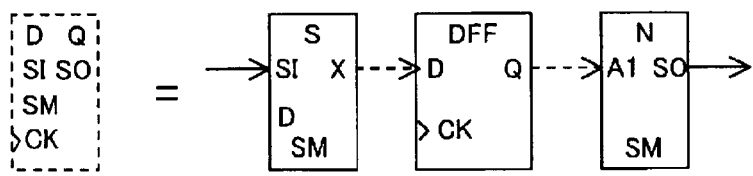
FIG. 8 shows an example of a soft macro and scan flip flop units resulting from the soft macro being developed as hard macros.

FIG. 7 shows an example of a layout condition before scan chain re-order. FIG. 7 shows only the scan flip flops and the scan chain interconnects connecting same, the cells that constitute the logic circuit being omitted. As shown in FIG. 8, the scan flip flops SFF, which are soft macros, are each developed as hard macros comprising a selector S, a delay flip flop DFF, and a NAND gate N. Scan flip flop units are therefore constituted by the selector S, delay flip flop DFF, and NAND gate N, the wiring paths within the scan flip flop units being as indicated by the broken lines, and the scan chain wiring paths between the scan flip flop units being as indicated by the solid lines. The wiring for the scan mode control signal and the clocks, and the wiring for the logic circuit interconnects are omitted in FIG. 8.

Six scan flip flop units are laid out in FIG. 7. Similarly to FIG. 8, the wiring in the scan flip flop units is denoted by the broken lines, while the scan chain wiring between units is denoted by the solid lines. The order of the scan chain wiring is SDI→①→②→③→④→⑤→⑥→SDO, as shown in FIG. 6. In the automatic layout step S4, the cells are placed in positions which are optimized according to a predetermined layout algorithm, and the interconnects between cells are also laid out.

The scan circuit may be constituted such that a test pattern can be scanned into the scan flip flops, and a post-operation test pattern can then be scanned out. Hence the order of the scan chain wiring denoted by the solid lines can be changed. However, because the scan flip flop units must be maintained, the wiring denoted by broken lines cannot be changed.

Returning now to FIG. 4, as described earlier, the solid-line scan chain wiring is extracted as scan chain data F20. Therefore, the scan chain re-order that changes the order of this wiring is performed in the automatic layout step S4.

Figure 9:
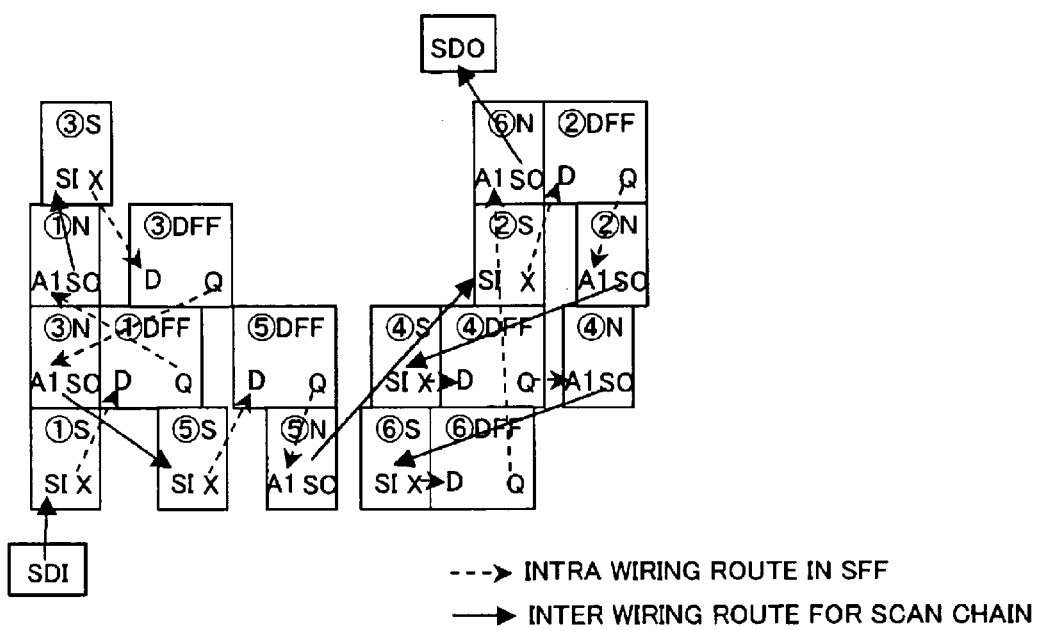
FIG. 9 shows an example of a layout condition after scan chain re-order.

FIG. 9 shows an example of a layout condition after scan chain re-order. According to the layout of the hard macros, the NAND of scan flip flop unit 1 and the selector of scan flip flop unit 3 adjoin one another, the NAND of 3 and the selector of 5 adjoin one another, the NAND of 2 and the selector of 4 adjoin one another, and the NAND of 4 and the selector of 6 adjoin one another. Therefore, the result of changing the order of the solid-line scan chain wiring to SDI→①→③→⑤→②→④→⑥→SDO by means of the re-order is shown in FIG. 9. A different re-order is also possible, but in comparison to the condition prior to the re-order which is shown in FIG. 7, the solid-line scan chain wiring is simplified and can be laid out.

Then, the above scan chain wiring order SDI→①→③→⑤→②→④→⑥→SDO is generated as a scan chain order file F22.

As shown in FIG. 4, once the order data F22 for the optimized scan chain wiring has been generated, a netlist NL4 that comprises a test circuit is again generated with respect to the netlist NL1 by a test circuit synthesis step S11. Here, the order of connecting the scan flip flops that constitute the test circuit is determined in accordance with the order data of the scan chain order file F22. Accordingly, the netlist NL4 thus generated is the same as the netlist NL2 in FIG. 6 other than the fact that the order of the scan chain wiring is SDI→①→③→⑤→②→④→⑥→SDO.

The generation of the netlist NL4 is also made feasible by changing the order of the scan chain wiring of the netlist NL2 shown in FIG. 6 to the order of the scan chain order file F22.

A test circuit of the netlist NL4 is constituted by scan flip flops which are soft macros. Hence, similarly to the conventional example, the test patterns F12 are generated with respect to the netlist NL4 in the test pattern automatic generation step S12. At such time, reference is made to the logic library F10 that comprises logic data for standard cells and scan flip flops. As described earlier, the test patterns F12 include an input test pattern and an expected-value test pattern.

Next, in the logic optimization step S13, the soft macros in the netlist NL4 are developed as hard macros, whereby the netlist NL4 is converted into the netlist NL5. In the logic optimization step S13, the soft-macro scan flip flops are developed as hard-macro standard cells as in the scan flip flop conversion step S10, and, in addition, logic compression is carried out by combining the newly developed standard cells and the neighboring standard cells originally present, and substituting the combined cells for different cells that implement the same function is performed. By changing the combination of the plurality of standard cells in this manner, an integrated circuit of a reduced scale can be created.

Figure 10:
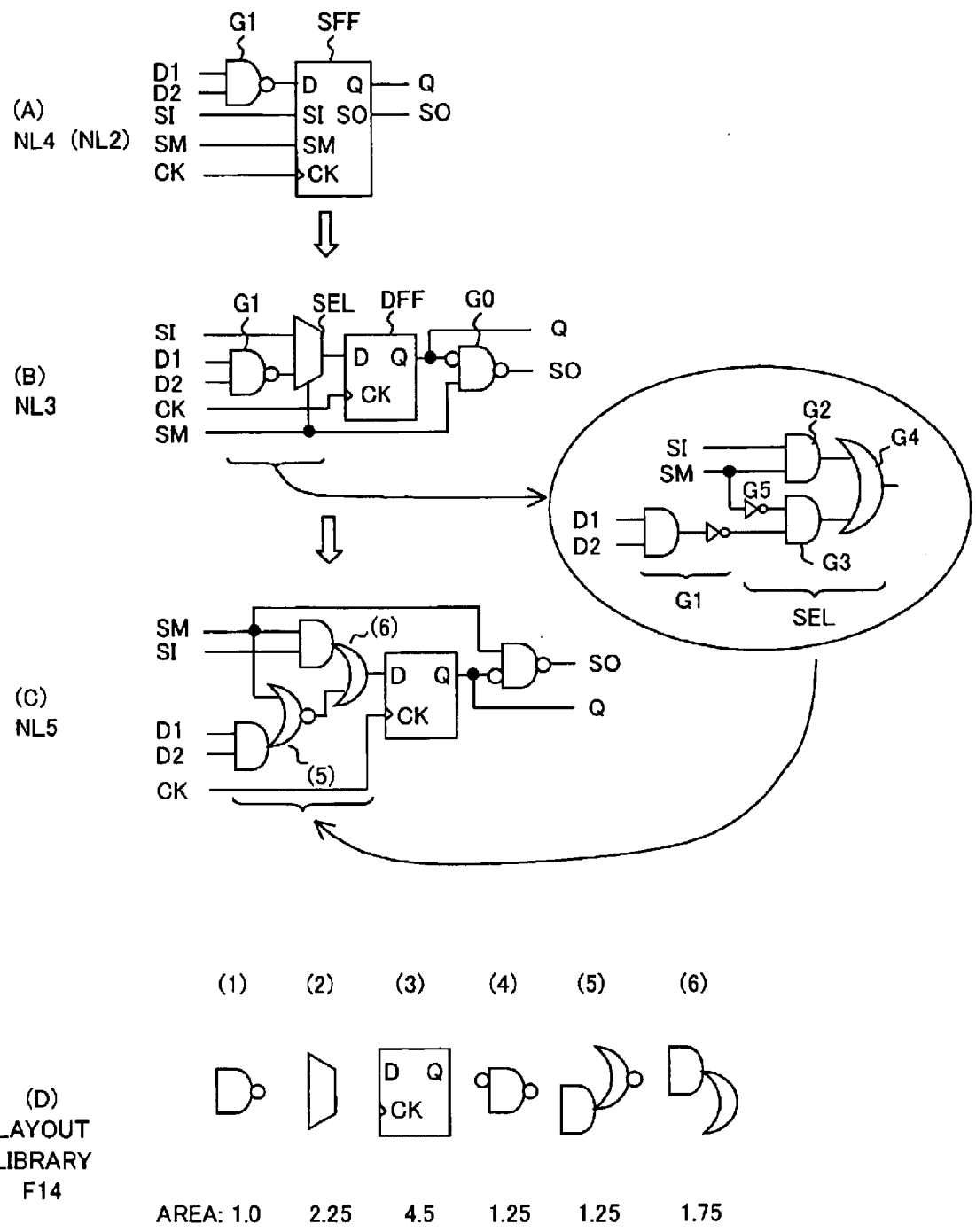
FIG. 10 shows an example of a logic optimization step.

FIG. 10 shows an example of the logic optimization step. FIG. 10 shows an example in which the netlist NL4 ((A) in the figure) is converted into the netlist NL5 ((C) in the figure) by way of logic optimization. A NAND gate G1 is present in the stage preceding the scan flip flop SFF in the netlist NL4. The scan flip flop SFF which is a soft macro in the netlist NL4 is shown developed as the standard cells SEL, SFF, and GO, which are hard macros, in (B) in the middle of the figure. This state is the same as that of the netlist NL3.

Here, a field on the center-right of the figure shows a logic circuit produced by developing the NAND gate G1 as an AND gate and an inverter, and developing the selector SEL as AND gates G2 and G3, an OR gate G4 and an inverter G5. When the AND gate G3 and the two inverters of the preceding stage are combined, same can be converted into a NOR gate. As a result, by way of logic optimization, the NAND gate G1 and the selector SEL are substituted for an AND/NOR gate (5) and an AND/OR gate (6) in the netlist NL5.

FIG. 10(D) shows an example of the layout library in which the area ratio of the hard macros (1) through (6) is shown on the basis of the NAND gate being 1.0. In other words, the total of the area ratios of the NAND gate G1 (1) and the selector SEL (2) is 1.0+2.25=3.25, whereas the total of the area ratios of the AND/NOR gate (5) and the AND/OR gate (6) is 1.25+1.75=3.0, which means that the surface area can thus be made smaller than when the logic circuit is developed with the NAND gate G1 and the selector SEL.

As a result of performing logic compression between the cells which constitute the scan flip flop units, and neighboring cells by way of the above-described logic optimization, it is possible to at least suppress an increase in the surface area which would otherwise accompany the conversion of the delay flip flops in the logic circuit into scan flip flops, along with an increase in the surface area that would accompany the development of a soft macro as a plurality of hard macros.

Returning now to FIG. 4, the netlist NL5 generated by the logic optimization step S13 is a logic circuit in which standard cells containing hard macros are connected. Therefore, the automatic layout and wiring step S14 is performed on the basis of the netlist NL5 with reference to the layout library F14, and the corresponding layout data F16 is generated. At this stage, because the scan chain wiring is optimized and it has been verified that the layout is feasible, the re-ordering of the layout order is not performed. Further, because the test patterns F12 for the netlist NL4 formed on the basis of the order of the scan chain order file have already been generated, the re-order cannot be performed. This is because the scan circuit constitution that would result from such a re-order would be different.

In the automatic layout and wiring step S14, the delay interval data for the wiring thus laid out is calculated. At such time, a check is made of whether or not the setup time and hold time determined by the specifications of the signal wiring can be satisfied. The signal wiring is normally formed in order that the hold time can be satisfied in the layout step, and when the setup time cannot be satisfied, a delay gate is inserted in the signal wiring. A netlist NL6 in which a delay gate serving to satisfy the setup time and the hold time is thus added is also generated in the automatic layout and wiring step S14. The delay data F24 for this signal wiring is also generated.

Further, in the timing verification step S15 that follows, timing verification for the logic circuit is carried out in accordance with the netlist NL6, the delay data F24, and the test patterns F12. In cases where an error is detected in the timing verification, a delay gate is inserted so as to avoid errors.

According to the above embodiment example, in cases where a logic circuit test circuit is inserted, a layout library for the scan flip flops constituting the scan circuit is not required, and hence the library development period can be shortened. Further, even if a scan circuit is inserted, the circuit scale can be reduced to a certain extent by means of logic optimization.

In the flowchart in FIG. 4, the scan flip flop conversion step S10 and the logic optimization step S13 are different, and hence the standard cells which make up the netlists NL3 and NL5 are slightly different. In order to remove this difference, logic optimization may also be performed in the scan flip flop conversion step S10.

According to the present invention hereinabove, an integrated circuit having a logic circuit equipped with a scan circuit can be designed without generating a hard-macro library for the scan flip flops that constitute the scan circuit. Moreover, according to the present invention, the scale of the integrated circuit comprising the scan circuit can be reduced.

What is claimed is:

1. A design method for an integrated circuit having a logic circuit, comprising:
   a first step of converting a first netlist, which has connection data for a logic circuit in which a plurality of standard cells including at least a first flip flop are connected, into a second netlist by converting the first flip flops into second flip flops equipped with a scan function and adding scan chain interconnects that connect the second flip flops;
   a second step of generating a third netlist by substituting the second flip flops in the second netlist for a plurality of standard cells that constitute the second flip flops, and generating scan-chain interconnect data;
   a third step of performing layout of the standard cells and interconnects thereof which are contained in the third netlist, in accordance with the third netlist, optimizing an order of the scan chain interconnects on the basis of the scan chain interconnect data, and generating scan-chain interconnect order data;
   a fourth step of generating a fifth netlist, from a fourth netlist that includes the second flip flops, and scan chain interconnects that depend on the scan-chain interconnect order data, by substituting the second flip flops for a plurality of standard cells, and of performing layout of the standard cells and interconnects thereof which are contained in the fifth netlist, in accordance with the fifth netlist; and
   a step of generating logic circuit test patterns on the basis of the fourth netlist, wherein:
   the standard cells are registered in a layout library as hard macros that contain layout information, and the layout of the standard cells is performed in the fourth step with reference to the layout library, and
   the second flip flop having the scan function is not registered in the layout library as a hard macro that contains layout information.

2. The design method for an integrated circuit as claimed in claim 1, wherein the test patterns include an input test pattern that is inputted to the second flip flops in the logic circuit, and an expected-value test pattern, which is expected to be outputted by the second flip flops after a predetermined cycle operation.

3. The design method for an integrated circuit as claimed in claim 1, wherein the second flip flops and standard cells contained in the fourth netlist are registered in a logic library that contains logic information, and reference is made to the logic library in the test pattern generation step.

4. The design method for an integrated circuit as claimed in claim 1, wherein the fourth netlist is formed by converting the first flip flops contained in the first netlist into second flip flops and adding scan chain interconnects that depend on the scan-chain interconnect order data.

5. A design method for an integrated circuit having a logic circuit, comprising:

a first step of converting a first netlist, which has connection data for a logic circuit in which a plurality of standard cells including at least a first flip flop are connected, into a second netlist by converting the first flip flops into second flip flops equipped with a scan function and adding scan chain interconnects that connect the second flip flops;

a second step of generating a third netlist by substituting the second flip flops in the second netlist for a plurality of standard cells that constitute the second flip flops and performing optimization by substituting the substitute standard cell and neighboring standard cell for a different standard cell of a smaller surface area; and a third step of performing layout of the standard cells and interconnects thereof which are contained in the third netlist, in accordance with the third netlist, wherein:

the standard cells are registered in a layout library as hard macros that contain layout information, and the layout of the standard cells is performed in the third step with reference to the layout library, and the second flip flop having the scan function is not registered in the layout library as hard macro that contains layout information.

6. The design method for an integrated circuit as claimed in claim 5, wherein the standard cells are registered in a layout library as hard macros that contain layout information, and the optimization involving substitution for different standard cell is performed in the second step with reference to surface area information of the layout library.

* * * * *

UNITED STATES PATENT AND TRADEMARK OFFICE
CERTIFICATE OF CORRECTION

PATENT NO.       : 6,990,642 B2                                            Page 1 of 1
APPLICATION NO. : 10/634857
DATED            : January 24, 2006
INVENTOR(S)      : Toshio Arakawa It is certified that error appears in the above-identified patent and that said Letters Patent is hereby corrected as shown below:

In Title page Insert [57]
Page, Column 2 (Abstract), Line 6, delete "flip-flops" and insert
- - flip flops - - therefor.
Page, Column 2 (Abstract), Line 10, delete "laid-out" and insert - - laid out - - therefor.
Page, Column 2 (Abstract), Line 13, delete "flip-flops" and insert - - flip flops - -
therefor.
Page, Column 2 (Abstract), Line 15, delete "flip-flops" and insert - - flip flops - -
therefor.
Page, Column 2 (Abstract), Line 17, delete "laid-out" and insert - - laid out - - therefor.

Signed and Sealed this

Fifteenth Day of August, 2006

JON W. DUDAS
*Director of the United States Patent and Trademark Office*